(12) United States Patent
Kohl et al.

(10) Patent No.: US 9,406,592 B2
(45) Date of Patent: Aug. 2, 2016

(54) CONDUCTOR STRIP WITH CONTACT AREAS HAVING CUTOUTS

(71) Applicant: Continental Automotive GmbH, Hannover (DE)

(72) Inventors: Nico Kohl, Hersbruck (DE); Martin Metzler, Nuremberg (DE); Sven Egelkraut, Nuremberg (DE); Markus Leicht, Fuerth (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 14/735,300

(22) Filed: Jun. 10, 2015

(65) Prior Publication Data

US 2015/0357303 A1    Dec. 10, 2015

(30) Foreign Application Priority Data

Jun. 10, 2014    (DE) .................. 10 2014 008 587

(51) Int. Cl.
*H01L 23/495* (2006.01)
*H01L 23/00* (2006.01)
*H01L 23/498* (2006.01)

(52) U.S. Cl.
CPC .... *H01L 23/49544* (2013.01); *H01L 23/49548* (2013.01); *H01L 23/49838* (2013.01); *H01L 24/33* (2013.01); *H01L 24/40* (2013.01); *H01L 24/73* (2013.01); *H01L 24/83* (2013.01); *H01L 24/84* (2013.01); *H01L 24/92* (2013.01); *H01L 23/495* (2013.01); *H01L 2224/32227* (2013.01); *H01L 2224/32245* (2013.01); *H01L 2224/33181* (2013.01); *H01L 2224/37013* (2013.01); *H01L 2224/4001* (2013.01); *H01L 2224/40095* (2013.01); *H01L 2224/40106* (2013.01); *H01L 2224/40221* (2013.01); *H01L 2224/40225* (2013.01); *H01L 2224/73263* (2013.01); *H01L 2224/8384* (2013.01); *H01L 2224/83201* (2013.01); *H01L 2224/8484* (2013.01); *H01L 2224/84201* (2013.01); *H01L 2224/92142* (2013.01); *H01L 2224/92246* (2013.01)

(58) Field of Classification Search
CPC .................. H01L 23/49548; H01L 23/49524; H01L 23/49838; H01L 23/49541; H01L 23/49544
See application file for complete search history.

(56) References Cited

U.S. PATENT DOCUMENTS

| 7,264,999 | B2 * | 9/2007 | Xiaochun ......... H01L 23/49541 29/243.56 |
| 8,124,449 | B2 | 2/2012 | Meyer-berg et al. .......... 438/107 |
| 8,253,224 | B2 * | 8/2012 | Hu .................... H01L 23/49524 257/666 |
| 8,513,784 | B2 * | 8/2013 | Lu ..................... H01L 23/49537 257/666 |
| 8,987,879 | B2 | 3/2015 | Otremba et al. ............. 257/676 |
| 2003/0075785 | A1 * | 4/2003 | Crowley ........... H01L 23/49513 257/676 |
| 2009/0057854 | A1 | 3/2009 | Gomez et al. ................ 257/676 |
| 2010/0176508 | A1 | 7/2010 | Herbsommer et al. ....... 257/718 |
| 2011/0298116 | A1 | 12/2011 | Mizusaki et al. ............. 257/676 |

FOREIGN PATENT DOCUMENTS

| DE | 10139681 A1 | 3/2003 | ............. H01L 23/13 |
| DE | 102004057421 A1 | 6/2006 | ............ H01L 23/055 |

(Continued)

*Primary Examiner* — Alonzo Chambliss
(74) *Attorney, Agent, or Firm* — Slayden Grubert Beard PLLC

(57) ABSTRACT

A power semiconductor circuit includes at least one semiconductor having at least one contact area, and at least one bonding conductor strip having at least one contact region fastened on at least one of the contact areas. The contact region of the bonding conductor strip includes cutouts.

18 Claims, 3 Drawing Sheets

(56) References Cited

FOREIGN PATENT DOCUMENTS

| | | | | |
|---|---|---|---|---|
| DE | 102005030247 A1 | 1/2007 | ............ | H01L 23/488 |
| DE | 102009044641 A1 | 9/2010 | ............ | H01L 21/60 |
| DE | 102012105929 A1 | 1/2013 | ............ | H01L 21/60 |
| JP | 6113650 A | 1/1986 | ............ | H01L 21/52 |
| JP | 2007134394 A | 5/2007 | ............ | H01L 23/50 |

* cited by examiner

CONDUCTOR STRIP WITH CONTACT AREAS HAVING CUTOUTS

CROSS-REFERENCE TO RELATED APPLICATIONS

This application claims priority to DE Application No. 10 2014 008 587.2 filed Jun. 10, 2014, the contents of which are hereby incorporated by reference in their entirety.

TECHNICAL FIELD

The invention is related to semiconductor circuits, e.g., to power semiconductor circuits including semiconductors having contact regions with cutouts.

BACKGROUND

Power semiconductors with which contact can be made by means of thick-wire bonding wires are used for producing power electronics assemblies. These bonding wires are generally applied to an aluminum metallization on the chip by means of ultrasound-activated bonding.

The life of the assemblies is critically limited by the semiconductor contact, which is produced by means of thick-wire bonding technology. These aluminum bonding wires can be embodied with a diameter of up to 500 µm, depending on the current to be conducted, wherein the life decreases further as the diameter increases. Precisely for power electronics applications, with increasing technology optimization a decreasing chip area for the same power is expected and therefore the trend for a further-increasing wire thickness continues.

SUMMARY

One embodiment provides a power semiconductor circuit comprising at least one semiconductor, which has at least one contact area, wherein the semiconductor circuit also has at least one bonding conductor strip comprising at least one contact region, which is fastened on at least one of the contact areas, characterized in that the contact region of the bonding conductor strip has cutouts.

In a further embodiment, the cutouts extend through the bonding conductor strip, or wherein the cutouts extend only over part of the thickness of the bonding conductor strip and form a depression.

In a further embodiment, the cutouts have a circular or oval cross section, have a polygonal cross section or have the form of a continuous groove, whose longitudinal direction extends along a straight line, along a curved line, along an arc of a circle or along a line with straight sections which are angled with respect to one another.

In a further embodiment, the cutouts are distributed over an area section of the contact region which makes up at least 50%, 70% or 90% of the contact region.

In a further embodiment, the contact regions of the bonding conductor strip are connected to the contact areas via a sintered connecting layer.

In a further embodiment, the semiconductor circuit furthermore comprises conductor tracks which have at least one contact section, wherein at least one contact region of the bonding conductor strip is fastened on the contact section, in particular via a sintered connecting layer.

In a further embodiment, the power semiconductor circuit further comprises a printed circuit board, on which the contact area of the semiconductor is fastened by means of a sintered layer, wherein the contact region of the bonding conductor strip is fastened by means of a further sintered layer on a further one of the contact areas of the semiconductor, and wherein, based on the semiconductor, the further contact area is opposite that contact area which is fastened on the printed circuit board.

Another embodiment provides a method for producing a power semiconductor circuit comprising the following steps: producing cutouts in a region of a bonding conductor strip; and fastening the region of the bonding conductor strip in which the cutouts have been produced, as a contact region, on a contact area of a semiconductor or on a contact section of a conductor track.

In a further embodiment, the step of fastening comprises: applying sintering compound as green body to the contact area or to the contact section, pressing the contact region of the bonding conductor strip onto the sintering compound and subsequently sintering the sintering compound.

In a further embodiment, the method further comprises applying a sintering compound to a conductor track section of a printed circuit board and pressing the semiconductor onto the sintering compound, wherein then the step of applying the sintering compound to the contact area of the semiconductor is performed.

BRIEF DESCRIPTION OF THE DRAWINGS

Example embodiments of the invention are discussed in detail below with reference to the drawings, in which.

DETAILED DESCRIPTION

Figure 1:
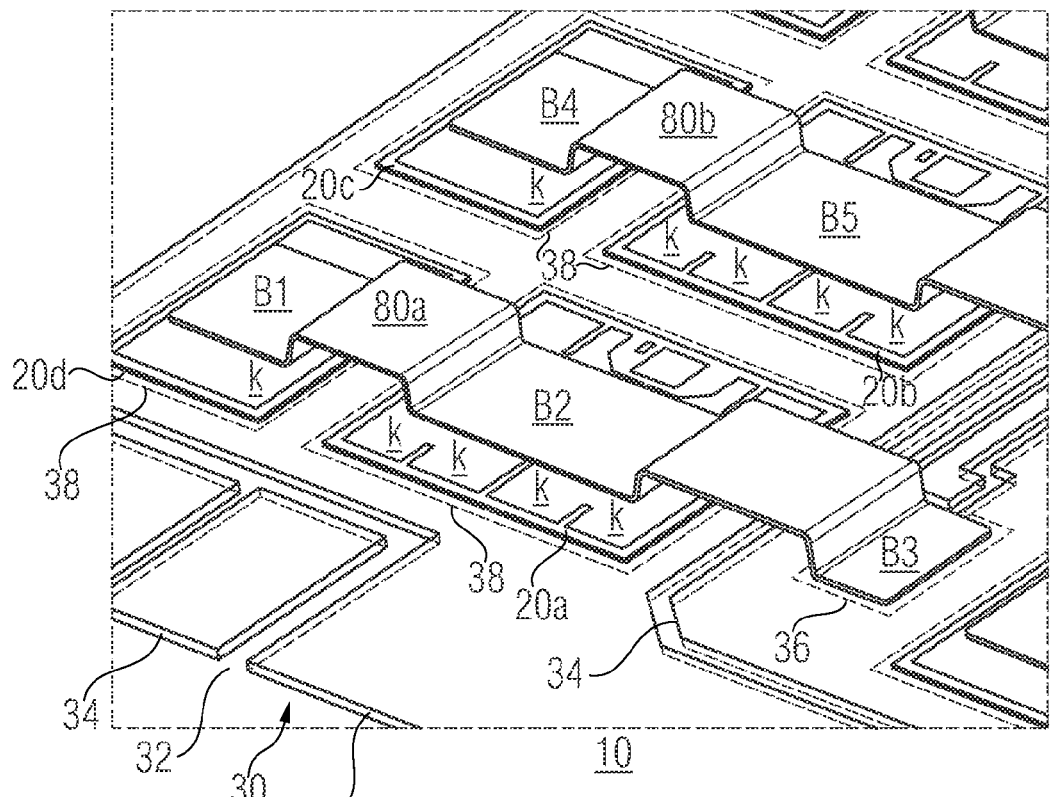
FIG. 1 shows a plan view of an embodiment of a power semiconductor circuit described here.

Embodiments of the invention are capable of extending the life of power semiconductor circuits.

Embodiments of the invention use a bonding conductor strip for making contact with or electrically connecting semiconductors (in particular the contact area or contact areas thereof), so that the surface of the bonding conductor strip (which extends in the longitudinal direction of the conductor strip) can be used for large-area contact-making. Instead of the end-side contact-making as mentioned in the introductory part of the description, the lateral surface (or a side thereof) of the conductor strip is therefore used. This provides a large area and therefore a high contact conductance. In order to prevent this large-area contact-making from resulting in a severe shortening of the life, cutouts are provided in the contact region. These cutouts extend in the bonding conductor strip or on the surface thereof. It has been identified that the shortening of the life is caused by varying stresses which occur during cyclic temperature loading, wherein, precisely in the case of large-area, completely (areally) continuous contacts, these stresses result in detachment of the contact made. Thus, the contact region of the bonding conductor strip is provided with cutouts, which significantly reduce the stresses and at the same time enable a high electrical cross section for contact-making.

In order to develop a power module which is optimized in terms of production and life, the bonding wires from the prior art are replaced by a contact film (also referred to as bonding strip or bonding conductor strip). By virtue of the contact film, during operation of the power electronics (i.e. the power semiconductor circuit), i.e. as a result of the cyclic heating and cooling of the component, mechanical stresses are introduced into the layers therebeneath. As a result, aging mechanisms are caused and the connection is limited in terms of life.

Embodiments of the invention may substantially extend the life of the upper-side semiconductor contact-making of a power module. Metallic strips or films which are applied flat to the chip (generally referred to here as semiconductor) are used for the contact-making. Said strips or films have the advantage that they conduct the current from the substrate to the chip and, owing to the connection technology used for them, extend the life massively in comparison with the prior art. Preferably, a sintered connecting layer for making contact with the two connection partners (chip and film) is located between the chip and the bonding conductor strip. In accordance with the invention, structures or cutouts are introduced into the bonding conductor strip. A wide variety of patterns or impressions are conceivable in this case as cutouts, which can be introduced with a wide variety of manufacturing methods. The weakened structure portions (produced by the structures or cutouts) in the contact film result in the mechanical stresses which occur in the case of thermomechanical loads which occur during operation of the power modules being considerably reduced, in particular by virtue of them enabling deformation of the conductor strip at the cutouts. The lower stresses result in a much reduced rate of aging, which is noticeable from a much extended life of the entire semiconductor circuit.

A power semiconductor circuit comprising at least one semiconductor is disclosed. The power semiconductor circuit is in particular a vehicle power semiconductor circuit, for example a current transformer, a voltage transformer, an inverter or a rectifier. Unhoused semiconductors, in particular so-called "bare chips" or "bare dies", are used as semiconductors. The semiconductors are, for example, transistors, thyristors or diodes, in particular IGBTs or field-effect transistors such as MOSFETs. The semiconductors are designed for rated currents of more than 1 A, 10 A, preferably more than 15, 30, 50 or 100 A. The power semiconductor circuit can have a plurality of semiconductors connected in parallel (or in series) in order to thus increase the current-carrying capacity or the rated voltage of the circuit. The power semiconductor circuit in particular comprises a B6C or B6U bridge, which is formed by the semiconductor, or else bridges with a lower (or else higher) number of phases.

The semiconductor(s) has/have at least one contact area, for example the contact areas of the connections through which the current to be controlled is conducted (emitter, collector, source, drain, cathode or anode). The contact area is the surface of a semiconductor substrate, which forms the semiconductor, or is a metallization layer on the semiconductor substrate. In addition, contact is made not only with the semiconductor, but additionally or alternatively with a section of a conductor track (for example a connection pad), as described here.

The semiconductor circuit furthermore has at least one bonding conductor strip comprising at least one contact region. The contact region preferably extends over the entire width of the conductor strip or over at least 50%, 80%, 90% or 95% of the width. The bonding conductor strip preferably has a silver layer on the surface, at least on the contact region, or comprises or consists of silver, in particular in order to improve contact-making. Instead of silver, another conductive material which is suitable for the sintering process described here can also be used. The bonding conductor strip can in particular be a copper strip, which bears a silver layer. The copper strip can be formed from copper or from copper with a tin additive (i.e. bronze). The bonding conductor strip has, for example, a thickness of at least 50, 70, 80 or 100 µm. However, the bonding conductor strip can also have a thickness of 100 µm, 120 µm, 150 µm or 200 µm or else 300 µm, wherein the thickness in terms of magnitude can differ by up to 10%, 25% or 50% from these thickness values. The thickness is in particular 50-200 µm and preferably 70-150 µm, wherein, in a preferred, exemplary configuration, the conductor strip is formed by a foil strip with a thickness of approximately 100 µm.

The contact region is the region within which the conductor strip is fastened to the contact areas. Therefore, the contact region is fastened to at least one of the contact areas (or conductor track sections). The type of fastening is in principle as desired in this case (soldering, in particular diffusion soldering, ultrasound welding, adhesive bonding, . . . ), wherein fastening is preferably performed using a sintered layer.

In order to reduce the stresses, the contact region of the bonding conductor strip is provided with cutouts. These extend starting from a surface of the conductor strip. The cutouts are preferably etched or produced using a different method, which preferably does not produce any additional stresses in the interior of the conductor strip at the rim of the cutout, for example a separation method. Alternatively, a forming method can also be used, for example punching or rolling, in order to produce the cutout.

The cutout is continuous (in the sense of a through-hole) or non-continuous (in the sense of a blind hole) in the thickness direction of the conductor strip. In other words, the cutouts extend through the bonding conductor strip, or the cutouts extend only over part of the thickness of the bonding conductor strip. In the last-mentioned case, said cutouts form a depression with a base (for example a groove) and, in the former case, said cutouts form a continuous cutout without a base.

The cutouts can have a circular or oval cross section, can have a polygonal cross section, or can have the form of a continuous groove. A further aspect is the extension perpendicular to the thickness direction of the conductor track, i.e. in a direction along the length or width of the conductor track. The longitudinal direction of the cutout can extend along a straight line, along a curved line, along an arc of a circle or an oval section or along a line with straight sections, which are angled with respect to one another. The line with straight sections which are angled with respect to one another in particular corresponds to the profile of a saw-tooth or triangular wave. Specific embodiments are illustrated by way of example in the figures, wherein in particular the profile form (straight, curved, circular arc) and the positional relationship of a plurality of cutouts with respect to one another and with respect to the rim or with respect to the center point of the contact area play a particular role and are illustrated in the figures.

Provision is furthermore made for the cutouts to be distributed over the contact region, in particular over an area section of the contact region which makes up a large portion of the total contact region. For example, the surface area of the area section makes up at least 50%, 70% or 90% of the contact region. The contact region is the region of the conductor strip in which a surface of the conductor strip is fastened, for example to the semiconductor or to a conductor track.

One embodiment involves connecting the at least one contact region of the bonding conductor strip to the at least one contact area of the semiconductor (or to a section of the conductor track) via a sintered connecting layer. The connecting layer is located on a surface of the contact region. The connecting layer is located on a contact area of the semiconductor or on a section of a conductor track. The connecting layer is located between the contact region of the conductor track, on the one hand, and the contact area of the semiconductor or the section of the conductor track, on the other hand, and forms a mechanical (cohesive) connection which conducts on. The sintered connecting layer is electrically conductive. The connecting layer in particular comprises silver. The connecting layer is in addition porous, in particular with a porosity of >50%, >70%, >80% or >95%, preferably from 50%-99% or 75%-99%.

The power semiconductor circuit can additionally comprise conductor tracks, in particular conductor tracks on a surface of a printed circuit board. The conductor tracks have at least one contact section. This contact section is provided for surface contact-making, in particular for connection to the bonding conductor strip. At least one contact region of the bonding conductor strip is fastened on the contact section. This fastening can be provided in the same way as the connection between the semiconductor and the conductor strip (soldering, in particular diffusion soldering, ultrasound welding, adhesive bonding, ... ). In particular, the contact region of the conductor strip is fastened on the contact section via a sintered connecting layer. This sintered connecting layer between the conductor strip and the conductor track is configured as the sintered connecting layer described here between the contact region of the conductor strip and the contact area of the semiconductor.

Therefore, provision can be made for the power semiconductor circuit to comprise a printed circuit board, on which the contact area of the semiconductor is fastened by means of a sintered layer. The contact region of the bonding conductor strip is fastened on a further one of the contact areas of the semiconductor by means of a further sintered layer. Based on the semiconductor, the further contact area is arranged opposite that contact area which is fastened on the printed circuit board. In other words, the semiconductor can have two contact areas, which extend on opposite sides of the semiconductor. One of the contact areas is connected to the contact region of the bonding conductor strip via a sintered connecting layer, while the contact area of the semiconductor which is opposite this is connected to the printed circuit board (in particular to the contact section of the conductor track) via a further sintered connecting layer.

The conductor strip comprises in particular two contact regions, wherein a contact region (with cutouts) is located at each of the two ends of the conductor strip. A contact region at one of the ends can be fastened on the contact area of the semiconductor, while the other contact region at the opposite end of the conductor strip is fastened on the contact section of the conductor track. The cutouts in the contact section which is connected to the conductor track are optional. Instead of being fastened to the contact section of the conductor track, the conductor strip can be fastened to a different connection surface, for example to a surface of a male connector pin or another electrical connection component part.

In addition, a method for producing a power semiconductor circuit, in particular a power semiconductor circuit as described herein, is disclosed.

The method comprises the following steps:
producing cutouts in a region of a bonding conductor strip (for example a bonding conductor strip as described here); and
fastening the region of the bonding conductor strip in which the cutouts have been produced, as a contact region, on a contact area of a semiconductor or on a contact section of a conductor track.

The cutouts produced in the production method can in particular be configured in the same way as the cutouts in the semiconductor circuit described herein and are produced, for example, by means of etching or embossing or punching.

The fastening step can comprise the following step: applying sintering compound (for example the sintering compound described here), as a green body, to the contact area or to the contact section. In addition, the contact region of the bonding conductor strip is pressed onto the sintering compound or the contact region is pressed into the sintering compound. Then, the sintering compound is sintered.

The pressing is performed at a pressure of 0.1-10 kg placement force (in the case of an area of 1 cm$^2$). The pressing is performed for a duration of 2 s-60 s, preferably 5-30 s, for example 5 to 10 or 20 s. During the pressing of the conductor strip onto or into the sintering compound, the sintering compound or the semiconductor or a placement head which positions the semiconductor is heated, for example to a temperature of 100° C., 140° C. or 170° C.

The sintering step comprises heating the sintering compound and exerting a pressure (simultaneously) on the sintering compound. A sintering mold exerts the pressure, for example 5-30 MPa or 15-25 or 30 MPa, and heats (inter alia) the sintering compound by virtue of the mold having a temperature of 200-300° C. or 250-300° C. The sintering is performed for a duration of 10-600 s, for example from 20-360 s, in particular from 45 s-90 s.

In addition, a sintering compound can be applied to a conductor track section of a printed circuit board. The semiconductor is pressed onto the sintering compound, for example with the abovementioned placement force. Then, further sintering compound is applied to the contact area of the semiconductor. The contact region of the bonding conductor strip is pressed into this sintering compound (as green body) and this further sintering compound is sintered.

(In each case) one drying step can be provided between the application of the sintering compound and the pressing of the semiconductor and/or the pressing of the contact region, in which drying step in particular solvents within the sintering compound are at least partially removed.

The sintering compound is applied by pressing.

An example of a production process is illustrated below:
Step 1: Printing the printed circuit board, in particular a "direct copper bonded" printed circuit board (also referred to as DCB substrate), with sintering compound (in particular silver sintering compound).
Step 2: Drying the sintering compound applied in step 1.
Step 3: Printing the semiconductor (as bare die) onto the dried sintering compound.
Step 4: Sintering the sintering compound so as to fasten the semiconductor. As a result, a first sintered connecting layer is formed from the sintering compound.
Step 5: A further sintering compound is applied to the semiconductor, in particular to a contact area of the semiconductor (on the side remote from the printed circuit board).
Step 6: Drying the further sintering compound applied in step 5.
Step 7: Pressing a contact region of a bonding conductor strip into the dried sintering compound from step 6.
Step 8: Sintering the sintering compound from step 7 in order to fasten the contact region of the bonding conductor strip. As a result, a second sintered connecting layer is formed from the further sintering compound from step 5.

The steps are preferably performed one after the other in numerical order.

The contact area of the semiconductor in particular comprises palladium, for example in the form of a nickel-palladium layer or a nickel-palladium-gold layer, or can be in the form of a nickel-gold layer.

FIG. 1 shows a semiconductor circuit 10 comprising a plurality of semiconductors 20a-d, which each have contact areas K. A plurality of bonding conductor strips 80a, b are fastened on the contact areas K. For this purpose, the bonding conductor strips 80a, b have contact regions B1-B5, in which the bonding conductor strips 80a, b have surfaces, which are fastened mechanically and electrically conductively to the contact areas K of the semiconductors 20a-d. A printed circuit board 30 is used as carrier of the semiconductor circuit and comprises a substrate 32 (in the form of an electrical insulator), on which a structured conductor layer forms conductor tracks 34. The conductor tracks comprise contact sections 36 (illustrated by means of a dashed line), on which in each case at least one contact region B3 of the conductor strips 30a, b is fastened. These contact regions B3 which are fastened to the contact sections 36 of the conductor tracks are not necessarily provided with cutouts and can be soldered, for example, or applied by means of a sintered layer. The semiconductors 20a-d, in particular with contact areas of the semiconductors facing the conductor tracks (not illustrated since hidden by the semiconductors), are fastened on further contact sections 38 (illustrated by dotted line) of the conductor tracks. This fastening and the fastening of the contact regions of the conductor strip to the contact areas are in each case realized by a sintered fastening layer.

Figure 2:
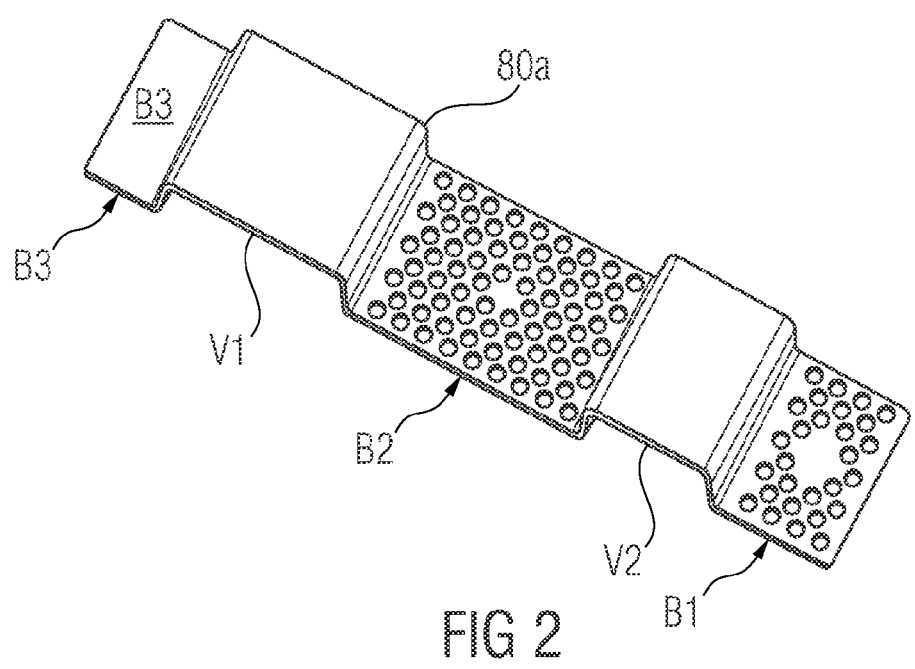
FIG. 2 shows a plan view of a first embodiment of a bonding conductor strip described here.
Figure 3:
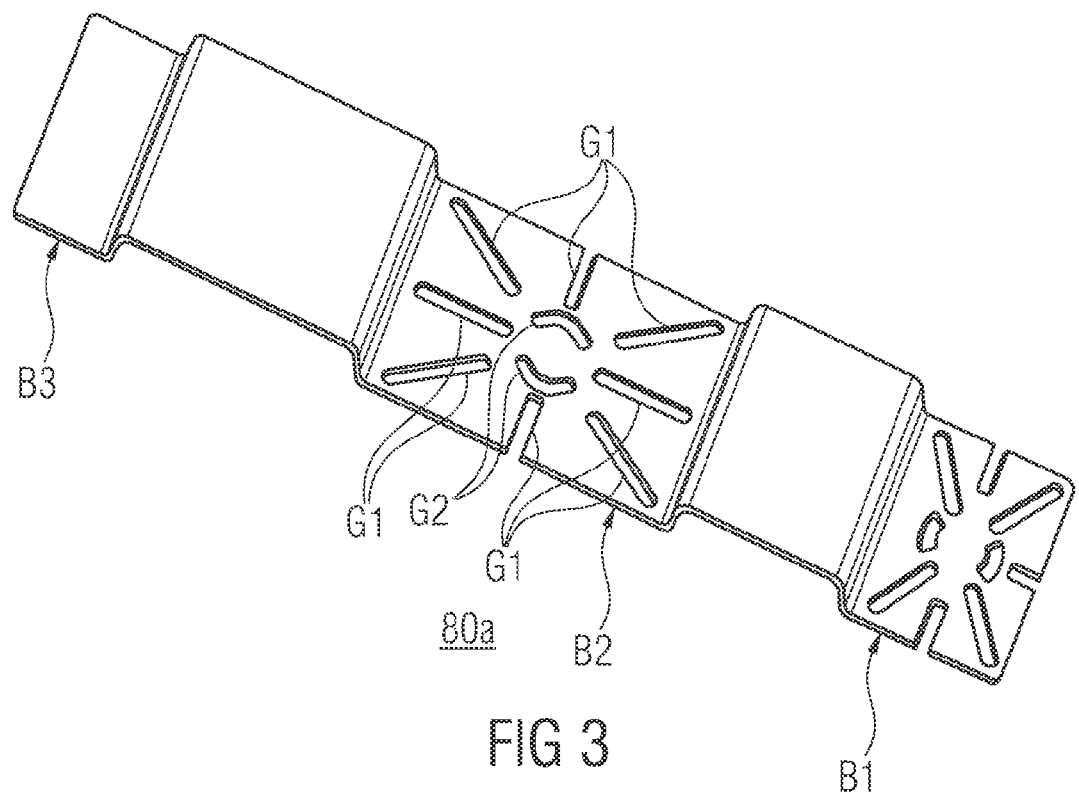
FIG. 3 shows a plan view of a second embodiment of a bonding conductor strip described here.
Figure 4:
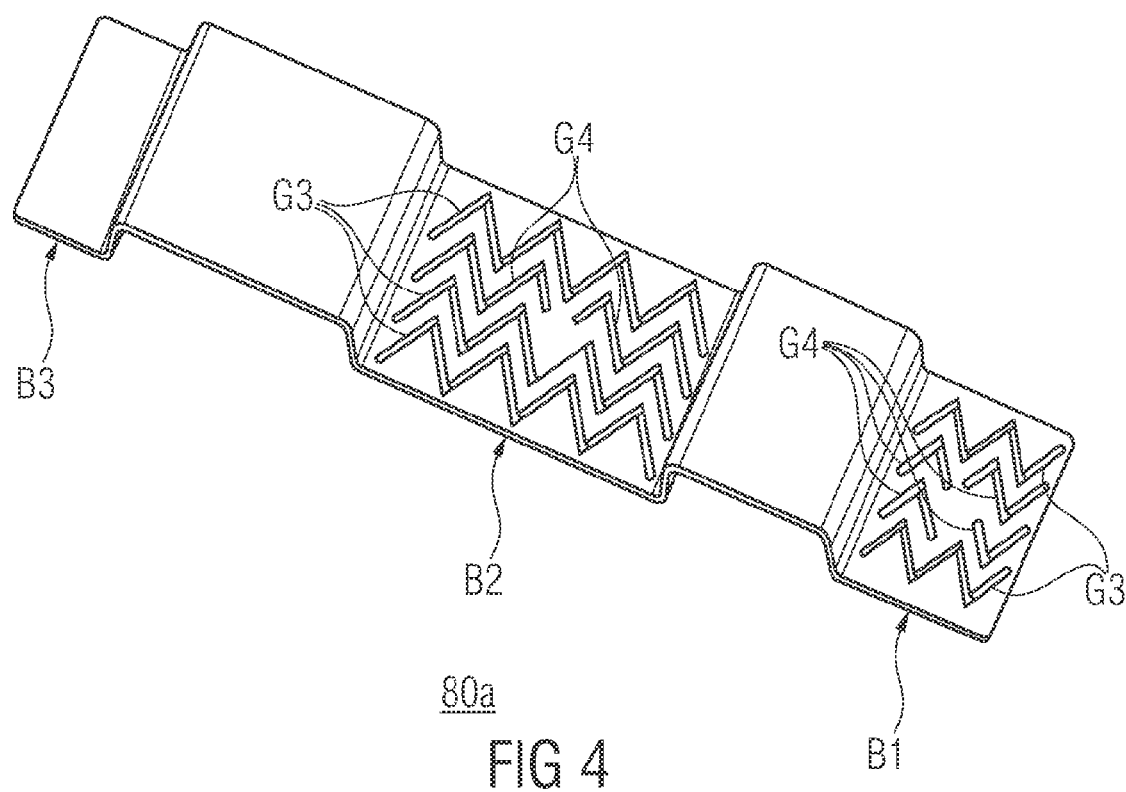
FIG. 4 shows a plan view of a third embodiment of a bonding conductor strip described here.

In order to reduce the mechanical stress at the contact regions B1, B2 and B4, B5, which are connected to contact areas K of the semiconductors 20a, b, at least these contact regions B1, B2 and B4, B5 of the conductor strips have cutouts, which are illustrated in more detail by way of example in FIGS. 2-4. The contact regions B1, B2 and B4, B5 of the conductor strips are preferably fastened to the relevant contact areas K via a sintered connecting layer. The semiconductors 20a, b are fastened to the conductor tracks 34 by a (further) sintered connecting layer.

FIG. 2 shows a first embodiment of the conductor strip 80a, wherein only the contact regions B1, B2 are provided with cutouts and the contact region B3, which is connected to the printed circuit board, is continuous and in particular formed as a flat section without any cutouts. The contact regions B1 and B2 have circular cutouts arranged in rows and columns. The cutouts have the same shape and the same size. The cutouts are uniformly distributed, wherein the cutouts with a lower density are provided in the center of the contact regions B1 and B2 rather than in regions outside the center. In particular, the cutouts are distributed uniformly apart from in each case one point in the center of the contact regions, wherein a cutout should be provided at this point in accordance with the row and column arrangement but is omitted. Successive rows are offset by half a pitch (of the row) so that all of the cutouts which are directly adjacent to a specific cutout have the same spacing from this cutout.

Connecting regions V1, V2 which connect the contact regions to one another and are formed without any cutouts, are formed between the contact regions B1-B3 of the conductor strip 80a. The connecting regions V1, V2 have a greater spacing from the printed circuit board than the contact regions in order to avoid short circuits. The connecting regions are offset with respect to the contact regions in the normal direction of the connecting regions V1, V2 or the contact regions.

FIG. 3 shows a second embodiment of the conductor strip 80a, wherein only the contact regions B1 and B2 are provided with cutouts. A first group G1 of cutouts is provided in the form of straight slots, which are formed radially with respect to the center of the respective contact region. A first subgroup of this first group G1 reaches as far as the edge of the contact region (or of the conductor strip), with the result that the slot is open on one side. A second subgroup of this first group does not reach up to the edge, with the result that the relevant slots are closed at both ends. A second group G2 of cutouts is provided in the form of slots, which extend substantially along a segment of a circle. The segment of a circle spans in each case less than 180° and more than 90°, in particular more than 120° or 150°. The first group G1 is distributed around the second group G2. The slots in the first group G1 are distributed uniformly circumferentially around the center of the contact region in respect of their angle relative to one another. The second group G2 spans the center of the contact region, wherein no cutout is provided in the center itself, but the second group G2 extends around the center.

FIG. 4 shows a third embodiment of the conductor strip 80a, wherein only the contact regions B1 and B2 are provided with cutouts. The cutouts extend along lines which follow a triangular curve (in the form of an equilateral triangle). A first group G3 of cutouts extends substantially over the entire length of the contact region, while a second group G4 is interrupted by cutouts in the center of the contact region. The second group G4 extends beyond the center of the contact region and the first group G3 extends further removed from the center than the second group G4.

Figure 5:
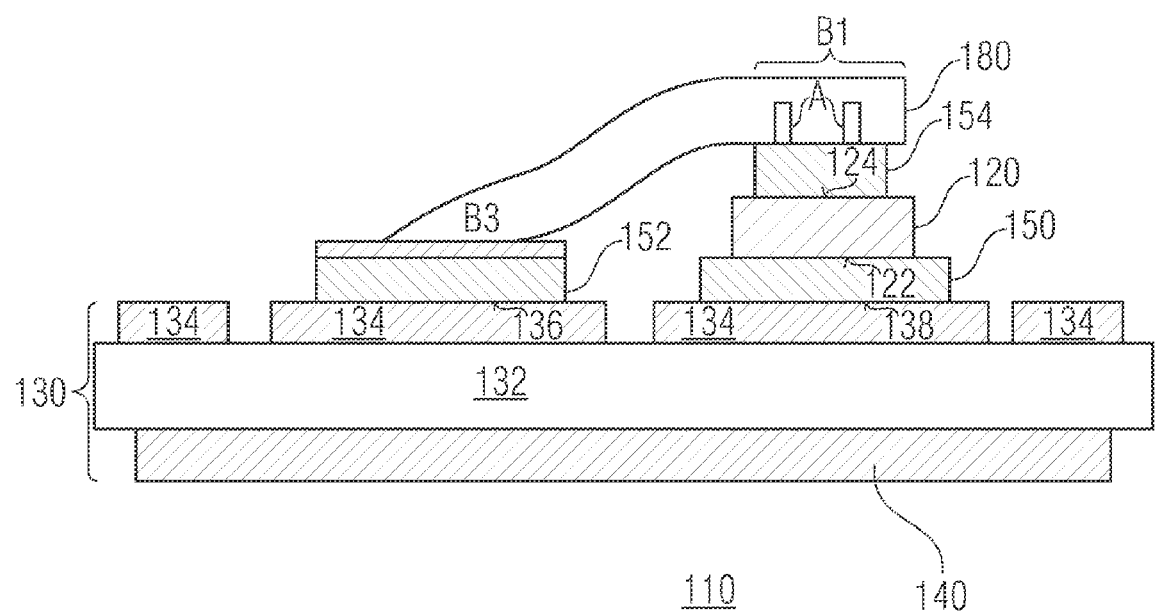
FIG. 5 shows a cross-sectional illustration of an embodiment of a power semiconductor circuit described here.

FIG. 5 shows a cross-sectional illustration of an embodiment of a power semiconductor circuit 110 described here. A printed circuit board 130 comprises a substrate 132, which is surrounded on both sides by conductor layers. One of the conductor layers is structured and forms conductor tracks 134. The opposite conductor layer is continuous and is fastened on a heat sink 140.

A first sintered connecting layer 150, by means of which a first contact area 122 of a semiconductor 120 is fastened on the contact section 138 of the conductor track, is located on a contact section 138 of the conductor track 134. A second sintered connecting layer 154 is provided on a second contact area 124, which is on the side of the semiconductor 120 which is opposite the first contact area. Said second sintered connecting layer fastens the second contact area 124 of the semiconductor 120 to a contact region B1 of a bonding conductor strip 180. Cutouts A which extend only through part of the thickness of the conductor strip and which are open towards the contact area 124 or towards the semiconductor 129, are provided in this contact region B1 in the bonding conductor strip 180. The connection between a further contact region B3 is only illustrated schematically and comprises a further sintered connecting layer 152, by means of which the contact region B3 is fastened on the contact section 136 or the surface thereof of the conductor track 134. The connecting layers 150 and 152 are produced simultaneously using the identical process steps. The process steps for producing the connecting layer 154 are performed after the abovementioned process steps.

The sintered connecting layers are sintered silver layers. Connecting layers on the contact area of a semiconductor are preferably sintered connecting layers. Connecting layers on contact sections of a conductor track can likewise be sintered connecting layers, but can also be layers of solder or can be connections produced by means of ultrasound welding of the conductor strip.

Elements whose last two numerals in the references correspond to one another are identical elements and can have the same function, properties and configurations. The contact areas K can correspond to the contact area 124, and viceversa. The contact area 122 can be formed and in particular fastened in the same way as the contact area 124.

What is claimed is:

1. A power semiconductor circuit comprising:
   at least one semiconductor having at least one contact area;
   at least one bonding conductor strip comprising at least one contact region fastened on at least one of the contact areas; and
   an array of cutouts in the at least one contact region of the at least one bonding conductor strip;
   wherein the array of cutouts is distributed at a first uniform density in a center area of the at least one contact region and at a second uniform density outside of the center area; and
   wherein the first uniform density is lower than the second uniform density.

2. The power semiconductor circuit of claim 1, wherein:
   the cutouts extend through the bonding conductor strip, or
   the cutouts extend only over part of a thickness of the bonding conductor strip and form a depression.

3. The power semiconductor circuit of claim 1, wherein the cutouts have:
   (a) a circular or oval cross section,
   (b) a polygonal cross section, or
   (c) a form of a continuous groove having a longitudinal direction that extends along a straight line, along a curved line, along an arc of a circle, or along a line with straight sections that are angled with respect to one another.

4. The power semiconductor circuit of claim 1, wherein the cutouts are distributed over an area section of the contact region that makes up at least 50% of the contact region.

5. The power semiconductor circuit of claim 1, wherein the contact regions of the bonding conductor strip are connected to the contact areas via a sintered connecting layer.

6. The power semiconductor circuit of claim 1, further comprising conductor tracks having at least one contact section, wherein at least one contact region of the bonding conductor strip is fastened on the at least one contact section via a sintered connecting layer.

7. The power semiconductor circuit of claim 1, further comprising a printed circuit board on which the contact area of the semiconductor is fastened by a sintered layer,
   wherein the contact region of the bonding conductor strip is fastened by a further sintered layer on a further one of the contact areas of the semiconductor, and
   wherein, with respect to the semiconductor, the further contact area is opposite the contact area that is fastened on the printed circuit board.

8. The power semiconductor circuit of claim 1, wherein the cutouts are distributed over an area section of the contact region that makes up at least 75% of the contact region.

9. The power semiconductor circuit of claim 1, wherein the cutouts are distributed over an area section of the contact region that makes up at least 90% of the contact region.

10. A method for producing a power semiconductor circuit comprising:
    producing an array of cutouts in a region of a bonding conductor strip;
    wherein the array of cutouts is distributed at a first uniform density in a center area of the at least one contact region and at a second uniform density outside of the center area;
    wherein the first uniform density is lower than the second uniform density; and
    fastening the region of the bonding conductor strip in which the cutouts have been produced, as a contact region, on a contact area of a semiconductor or on a contact section of a conductor track.

11. The method of claim 10, wherein the fastening comprises:
    applying sintering compound as green body to the contact area or to the contact section,
    pressing the contact region of the bonding conductor strip onto the sintering compound, and
    subsequently sintering the sintering compound.

12. The method of claim 11, further comprising:
    applying a sintering compound to a conductor track section of a printed circuit board, and
    pressing the semiconductor onto the sintering compound,
    wherein the step of applying the sintering compound to the contact area of the semiconductor is then performed.

13. The method of claim 10, wherein:
    the cutouts extend through the bonding conductor strip, or
    the cutouts extend only over part of a thickness of the bonding conductor strip and form a depression.

14. The method of claim 10, wherein the cutouts have:
    (a) a circular or oval cross section,
    (b) a polygonal cross section, or
    (c) a form of a continuous groove having a longitudinal direction that extends along a straight line, along a curved line, along an arc of a circle, or along a line with straight sections that are angled with respect to one another.

15. The method of claim 10, wherein the cutouts are distributed over an area section of the contact region that makes up at least 50% of the contact region.

16. The method of claim 10, wherein the contact regions of the bonding conductor strip are connected to the contact areas via a sintered connecting layer.

17. The method of claim 10, wherein the power semiconductor circuit further comprises conductor tracks having at least one contact section, wherein at least one contact region of the bonding conductor strip is fastened on the at least one contact section via a sintered connecting layer.

18. The method of claim 10, wherein the power semiconductor circuit further comprises a printed circuit board on which the contact area of the semiconductor is fastened by a sintered layer,
    wherein the contact region of the bonding conductor strip is fastened by a further sintered layer on a further one of the contact areas of the semiconductor, and
    wherein, with respect to the semiconductor, the further contact area is opposite the contact area that is fastened on the printed circuit board.

* * * * *